(12) United States Patent
Eggers

(10) Patent No.: US 11,041,926 B2
(45) Date of Patent: Jun. 22, 2021

(54) DIXON-TYPE WATER/FAT SEPARATION MR IMAGING

(71) Applicant: KONINKLIJKE PHILIPS N.V., Eindhoven (NL)

(72) Inventor: Holger Eggers, Ellerhoop (DE)

(73) Assignee: Koninklijke Philips N.V., Eindhoven (NL)

( * ) Notice: Subject to any disclaimer, the term of this patent is extended or adjusted under 35 U.S.C. 154(b) by 262 days.

(21) Appl. No.: 16/305,089

(22) PCT Filed: Jun. 1, 2017

(86) PCT No.: PCT/EP2017/063326
§ 371 (c)(1),
(2) Date: Nov. 28, 2018

(87) PCT Pub. No.: WO2017/207700
PCT Pub. Date: Dec. 7, 2017

(65) Prior Publication Data
US 2020/0319280 A1    Oct. 8, 2020

(30) Foreign Application Priority Data

Jun. 2, 2016    (EP) .................................... 16172658

(51) Int. Cl.
*G01R 33/48* (2006.01)
*G01R 33/561* (2006.01)
*G01R 33/565* (2006.01)

(52) U.S. Cl.
CPC ..... *G01R 33/4828* (2013.01); *G01R 33/5617* (2013.01); *G01R 33/56554* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 8,395,385 B2    3/2013  Lee et al.
2002/0032376 A1*  3/2002  Miyazaki ............... A61B 6/541
                                                600/410
(Continued)

OTHER PUBLICATIONS

Eggers et al "Dual-Echo Dixon Imaging With Flexible Choice of Echo Times" Magnetic Resonance in Medicine, vol. 65, No. 1, p. 96-107 (Sep. 21, 2010).
(Continued)

*Primary Examiner* — Walter L Lindsay, Jr.
*Assistant Examiner* — Frederick Wenderoth

(57) ABSTRACT

A method of Dixon-type MR imaging includes subjecting the object (10) to a first imaging sequence (31) including a series of refocusing RF pulses. A single echo signal is generated in the time interval between two consecutive refocusing RF pulses. The first echo signals from the object (10) are acquired at a first receive bandwidth using unipolar readout magnetic field gradients. The object (10) is further subject to a second imaging sequence (32), which includes a series of refocusing RF pulses. A pair of second echo signals is generated in each time interval between two consecutive refocusing RF pulses. The pairs of second echo signals from the object (10) are acquired at a second receive bandwidth using bipolar readout magnetic field gradients. The second receive bandwidth is higher than the first receive bandwidth. Signal contributions from water protons and fat protons are separated and an MR image is reconstructed.

19 Claims, 3 Drawing Sheets

(58) Field of Classification Search
USPC .......................................................... 324/309
See application file for complete search history.

(56) References Cited

U.S. PATENT DOCUMENTS

| | | | |
|---|---|---|---|
| 2004/0043022 A1 | 3/2004 | Heuer et al. | |
| 2004/0064032 A1 | 4/2004 | Ma | |
| 2009/0093704 A1 | 4/2009 | Ma | |
| 2012/0301000 A1 | 11/2012 | Bornert et al. | |
| 2013/0208969 A1* | 8/2013 | Bashir | G06T 7/0012 382/131 |
| 2013/0214783 A1 | 8/2013 | Zhao | |
| 2013/0300410 A1* | 11/2013 | Niendorf | G01R 33/56509 324/307 |
| 2013/0314088 A1* | 11/2013 | Wiggins | G01R 33/34092 324/322 |
| 2014/0003694 A1 | 1/2014 | Weng | |
| 2014/0210471 A1* | 7/2014 | Stemmer | G01R 33/56554 324/309 |
| 2014/0285195 A1* | 9/2014 | Stemmer | G01R 33/4818 324/309 |
| 2014/0368195 A1 | 12/2014 | Eggers et al. | |
| 2015/0161784 A1* | 6/2015 | Ma | G06T 7/0012 382/131 |
| 2016/0033605 A1 | 2/2016 | Stemmer et al. | |
| 2016/0033606 A1 | 2/2016 | Eggers | |
| 2016/0231405 A1 | 8/2016 | Eggers et al. | |

OTHER PUBLICATIONS

Lu et al "Water-Fat Separation With Bipolar Multiecho Sequences" Magnetic Resonance in Medicine, vol. 60, No. 1, Jun. 25, 2008, p. 198-209.

Redder et al "Multicoil Dixon Chemical Species Separation With an Iterative Least-Squares Estimation Method" Magnetic Resonance in Medicine, vol. 51, No. 1, Jan. 1, 2004 p. 35-45.

Xiang "Two-Point Water-Fat Imaging With Partially-Opposed Phase (POP) Acquisition: An Asymmetric Dixon Method" Magnetic Resonance in Med. 56 p. 572-584 (2006).

Ma et al "Fast Spin-Echo Triple-Echo Dixon (fTED) Technique for Efficient T2-Weighted Water and Fat Imaging" Magnetic Resonance in Medicine, vol. 58 p. 103-109.

Ma et al "Method for Efficient Fast Spin Echo Dixon Imaging" Magnetic Resonance in Imaging , vol. 48, p. 1021-1027 (2002).

Zong et al "Liver Fat Quantification Using a Multi-Step Adaptive Fitting Approach With Multi-Echo GRE Imaging" Magnetic Resonance in Medicine, vol. 72, No. 5, Dec. 9, 2013 p. 1353-1365.

* cited by examiner

PRIOR ART

DIXON-TYPE WATER/FAT SEPARATION MR IMAGING

CROSS REFERENCE TO RELATED APPLICATIONS

This application is a U.S. national phase application of International Application No. PCT/EP2017/063326, filed on Jun. 1, 2017, which claims the benefit of EP Application Serial No. 16172658.3 filed on Jun. 2, 2016 and is incorporated herein by reference.

FIELD OF THE INVENTION

The invention relates to the field of magnetic resonance (MR) imaging. It concerns a method of MR imaging of a portion of a body placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z-axis to the transverse plane (flip angle 90°).

After termination of the RF pulse, the magnetization relaxes back to the original state of equilibrium, in which the magnetization in the z direction is built up again with a first time constant $T_1$ (spin-lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each k-space line is digitized by collecting a number of samples. A set of k-space data is converted to an MR image, e.g., by means of Fourier transformation.

In MR imaging, it is often desired to obtain information about the relative contribution of water and fat to the overall signal, either to suppress the contribution of one of them or to separately or jointly analyze the contribution of both of them. These contributions can be calculated if information from two or more corresponding echoes, acquired at different echo times, is combined. This may be considered as chemical shift encoding, in which an additional dimension, the chemical shift dimension, is defined and encoded by acquiring two or more MR images at slightly different echo times. For water-fat separation, these types of experiments are often referred to as Dixon-type of measurements. By means of Dixon MR imaging or Dixon water/fat MR imaging, a water-fat separation is achieved by calculating contributions of water and fat from two or more corresponding echoes, acquired at different echo times. In general such a separation is possible because there is a known precessional frequency difference of hydrogen in fat and water. In its simplest form, water and fat images are generated by either addition or subtraction of the 'in-phase' and 'out-of-phase' datasets.

Several Dixon-type MR imaging methods have been proposed in recent years. Apart from different strategies for the water/fat separation, the known techniques are mainly characterized by the specific number of echoes (or 'points') they acquire and by the constraints that they impose on the used echo times. Conventional so-called two- and three-point methods require in-phase and opposed-phase echo times at which the water and fat signals are parallel and antiparallel in the complex plane, respectively. Three-point methods have gradually been generalized to allow flexible echo times. Thus, they do not restrict the angle or phase between the water and fat signals at the echo times to certain values anymore. In this way, they provide more freedom in imaging sequence design and enable in particular a trade-off between signal-to-noise ratio (SNR) gains from the acquisition and SNR losses in the separation. Sampling only two instead of three echoes is desirable to reduce scan time. However, constraints on the echo times may actually render dual-echo acquisitions slower than triple-echo acquisitions. Eggers et al. (Magnetic Resonance in Medicine, 65, 96-107, 2011) have proposed a dual-echo flexible Dixon-type MR imaging method which enables the elimination of such constraints. Using such Dixon-type MR imaging methods with more flexible echo times, in-phase and opposed-phase images are no longer necessarily acquired, but optionally synthesized from water and fat images.

Dixon-type MR imaging methods are often applied in combination with fast (turbo) spin echo sequences using multiple repetition or multiple acquisition approaches. Typically, two or three interleaved measurements with shifted readout magnetic field gradients and acquisition windows are employed. In FIG. 2, a schematic pulse sequence diagram of a conventional turbo spin echo (TSE) Dixon sequence is depicted. The diagram shows switched magnetic field gradients in the frequency-encoding direction (M), the phase-encoding direction (P) and the slice-selection direction (S). Moreover, the diagram shows RF excitation and refocusing pulses as well as the time intervals during which echo signals are acquired, designated by ACQ. The diagram covers the acquisition of the first three echo signals of one shot of the imaging sequence. The double arrows indicate the shifting of the readout magnetic field gradients (top) and the acquisition windows ACQ (bottom) between multiple repetitions of one shot with identical phase encoding. According to the shifting of the readout magnetic field gradients, different phase offsets of the signal contributions from water protons and fat protons, respectively, are obtained on which the Dixon-type water/fat separation is based.

A drawback of the conventional approach is that, in comparison to standard (non-Dixon) TSE sequences, a higher receive bandwidth is required for a given echo spacing in Dixon TSE sequences. This results in a significantly reduced SNR. This may be avoided by employing a larger echo spacing. However, longer or more echo trains are required in this case. This results in less coverage and more blurring in the reconstructed MR images, or in longer scan times. Furthermore, FID artifacts may be a problem with the conventional approach. A cancellation of FID artifacts by averaging of two acquisitions with opposite phases of the refocusing RF pulses is usually impracticable since it would require doubling (once more) the number of acquisitions and thus increase scan times even further. The US patent application US2016/0033605 concerns a multi-spin-echo acquisitions in which bipolar gradient pulses are employed to form echo-pairs between refocusing RF pulses.

From the foregoing it is readily appreciated that there is a need for an improved technique for Dixon-type MR imaging. It is consequently an object of the invention to provide a method that enables efficient Dixon water/fat separation in combination with a TSE acquisition.

SUMMARY OF THE INVENTION

In accordance with the invention, a method of MR imaging of an object placed in an examination volume of a MR device is disclosed. The method comprises the following steps:

subjecting the object to a first imaging sequence comprising a series of refocusing RF pulses, wherein a single echo signal is generated in each time interval between two consecutive refocusing RF pulses, acquiring the echo signals from the object at a first receive bandwidth using unipolar readout magnetic field gradients, subjecting the object to a second imaging sequence, which comprises a series of refocusing RF pulses, wherein a pair of echo signals is generated in each time interval between two consecutive refocusing RF pulses, acquiring the pairs of echo signals from the object at a second receive bandwidth using bipolar readout magnetic field gradients, wherein the second receive bandwidth is higher than the first receive bandwidth, and reconstructing a MR image from the acquired echo signals, whereby signal contributions from water protons and fat protons are separated.

According to the invention, two separate TSE sequences, the first and second imaging sequences, are used to acquire the single echo signals and the pairs of echo signals respectively. The timing of the bipolar readout gradients in the second imaging sequence is chosen to shift the acquisition windows of the echo signals such that appropriate phase offsets of the signal contributions from water protons and fat protons are provided on which the Dixon-type separation of these signal contributions is based in the reconstruction step.

The bipolar readout magnetic field gradients applied in the second imaging sequence are preferably stronger than the unipolar readout magnetic field gradients of the first imaging sequence, wherein each pair of echo signals is acquired using a corresponding pair of temporally adjoining readout magnetic field gradients having opposed polarities. It can thus be achieved that the duration of each dual-echo readout is essentially the same as that of the single-echo readout of the first acquisition.

More specifically, the echo signals generated by the first imaging sequence are acquired using the unipolar readout magnetic field gradients having a first gradient strength, and the pairs of echo signals generated by the second imaging sequence are acquired using the bipolar readout magnetic field gradient having a second gradient strength which is larger than the first gradient strength. Simultaneously, the first echo signals are acquired using a signal receiving bandwidth which is smaller than the signal receiving bandwidth used for the acquisition of the second echo signals. The whole acquisition is thus split up into two, usually interleaved sub-acquisitions, performed with a low-bandwidth sub-sequence (the first imaging sequence) and a high-bandwidth sub-sequence (the second imaging sequence), respectively. In the low-bandwidth sub-sequence, a high signal sampling efficiency is achieved by sampling the first echo signals during most of the interspacing between the refocusing RF pulses. This low-bandwidth and high sampling efficiency yields a high SNR. The first imaging sequence with its single-echo readout is actually the same as a standard TSE sequence and thus provides the same sampling efficiency. The second imaging sequence achieves only a lower sampling efficiency and provides a lower SNR per echo, since it has to cover the same gradient integral in about half the time. However, by sampling a pair of echo signals, it achieves a similar, high sampling efficiency and SNR as the first imaging sequence.

The MR image reconstructed from the echo signals acquired according to the invention benefits from the higher sampling efficiency and higher SNR of both imaging sequences. This applies to a reconstructed in-phase MR image (including both water and fat signal contributions as a conventional spin echo image) as well as to a water (or fat-suppressed) MR image.

It is the gist of the invention, in other words, to achieve efficient TSE Dixon imaging by combining a unipolar single-echo readout at a low receive bandwidth (first acquisition) with a bipolar dual-echo readout at a high bandwidth (second acquisition) to maximize the SNR.

In a preferred embodiment of the invention, each acquired pair of echo signals generated by the second imaging sequence is combined into a virtual echo signal, wherein signal contributions from water protons and fat protons are separated by a two-point Dixon technique using the echo signals generated by the first imaging sequence and the virtual echo signals. The SNR of a single-echo image reconstructed from the unipolar single-echo readout according to the invention is (ideally) by a square root of two higher than that in two single-echo images reconstructed from the bipolar dual-echo readout. Since the shifts of the two echo signals of the bipolar dual-echo readout are equal, except for the sign, the corresponding single-echo images can, after a suitable phase correction, be averaged to obtain a single-echo image with the same SNR as the single-echo image reconstructed from the unipolar single-echo readout. This still applies if only two partial echo signals are acquired in the bipolar dual-echo readout (to achieve favorable echo shifts at a particular field strength, e.g., or to accommodate constraints on the readout magnetic field gradient strength and slew rate imposed by the used MR apparatus). This then allows employing conventional two-point Dixon methods for the water/fat separation.

Alternatively, signal contributions from water protons and fat protons may be separated directly by a three-point Dixon technique using the three corresponding echo signals generated by the first and second imaging sequences.

The afore-described concept of virtual echoes combined from a bipolar dual-echo readout can advantageously be applied also in combination with a one-point Dixon method for water/fat separation. In this case the first imaging sequence can be dispensed with. In this embodiment, the method of the invention comprises the following steps:

subjecting the object to an imaging sequence, which comprises a series of refocusing RF pulses, wherein a pair of echo signals is generated in each time interval between two consecutive refocusing RF pulses, acquiring the pairs of echo signals from the object using bipolar readout magnetic field gradients, and reconstructing a MR image from the acquired echo signals, wherein each pair of echo signals is combined into a virtual echo signal, wherein signal contributions from water protons and fat protons are separated by a one-point Dixon technique using the virtual echo signals. This variant may be applied in combination with any other feature of the method of the invention disclosed herein, in particular regarding the concept of FID artifact suppression described below. The single-point method has basically the same advantages as discussed above (high SNR, good sampling efficiency). However, it relates only to single-echo instead of dual-echo Dixon imaging.

In more detail, the virtual echo signals may be computed as phasor weighted averages of the echo signals of each pair of echo signals. The voxel values in the three single-echo MR images $S_1$-$S_3$ can be modeled by $$S_1 = (W + c^*F)P_0P^*P_1,$$

$$S_2 = (W + F)P_0P_2,$$

$$S_3 = (W + cF)P_0PP_3,$$

with W and F being the magnitude of the water and fat signal, c being the complex weighting factor describing the amplitude and phase variation of a pure fat signal relative to a pure water signal at the (positive) echo shift, $P_0$ being the phasor representation of the (initial) phase at the spin echo, P being the phasor representation of the effect of main field inhomogeneity, and $P_1$-$P_3$ being the phasor representations of the effect of eddy currents. Relaxation effects are neglected for the sake of simplicity.

If $P_1$-$P_3$ are known from separate calibration measurements, they can be eliminated:

$$S'_1 = (W + c^*F)P_0P^*,$$

$$S'_2 = (W + F)P_0,$$

$$S'_3 = (W + cF)P_0P.$$

Setting $$W' = WP_0,$$

$$F' = FP_0,$$

then leads to $$S'_1 = (W' + c^*F')P^*,$$

$$S'_2 = (W' + F'),$$

$$S'_3 = (W' + cF')P,$$

which can be solved with existing complex-based three-point Dixon methods.

If $P_1$-$P_3$ are unknown, existing magnitude-based three-point Dixon methods can be applied instead.

Alternatively, it is suggested to first combine $S_1$ and $S_3$ into a virtual $S_{13}$ and then apply a two-point Dixon method to $S_2$ and $S_{13}$. This is motivated by the insight that $S_1$ and $S_3$ provide partially redundant information, since their amplitude is ideally equal. For the sake of simplicity, it is temporarily assumed that the readout gradient strength for the measurements of $S_1$ and $S_3$ is twice that for the measurement of $S_2$, and that the readout gradient polarity for the measurements of $S_1$ and $S_2$ is the same. Again for the sake of simplicity, it is then assumed that $$P_1 = P_2^2,$$

$$P_3 P_2^{*2},$$

which leads to $$S_1 = (W + c^*F)P_0P^*P_2^2,$$

$$S_2 = (W + F)P_0P_2,$$

$$S_3 = (W + cF)P_0PP^*_2{}^2.$$

and $$S^*_3 = (W + c^*F)P^*_0P^*P_2^2.$$

From $S_1$ and $S_3^*$, $P_0^2$ can be derived. Since it is expected to be spatially smooth, it can be filtered to reduce noise. $S_{13}$ is then obtained by $$S_{13} = S_1 + S^*_3 P_0^2,$$

for example. Optionally, $P_2$ can be derived from $S_2$, and $S_{13}$ can be multiplied with $P_2^*$.

Without the assumed relations between $P_1$-$P_3$, $P_0^2 P_1 P_3$ instead of $P_0^2$ can be derived from $S_1$ and $S_3^*$, and $S_{13}$ is then obtained by $S_{13} = S_1 + S^*_3 P_0^2 P_1 P_3$, for example.

Alternatively, it is suggested to apply a single-point Dixon method to $S_{13}$.

Flow compensation may be applied in accordance with the method of the invention by means of gradient moment nulling. In the first imaging sequence, like in a conventional TSE sequence, the zeroth moment of the readout magnetic field gradient is usually zero both at the echo time of the single echo signal and at the time of the subsequent refocusing RF pulse, while the first moment is only zero at the latter. For the phase encoding magnetic field gradient, only the zeroth moment is zero at the respective subsequent refocusing pulse. For the slice selection gradient, the typically applied magnetic field gradients for spoiling for FID artifact reduction prevent any flow compensation.

In the second imaging sequence, only the readout magnetic field gradient differs from the first imaging sequence.

Its zeroth moment is usually zero both at the echo times of the pair of echo signals and at the time of the subsequent refocusing RF pulse. Its first moment is non-zero at the echo time of the first of the pair of echo signals while it is zero at the echo time of the second of the pair of echo signals. In this way, differences between the two single-echo MR images reconstructed from the pair of echo signals can be exploited for an improved flow compensation. For example, a higher signal amplitude at a given voxel position in the second single-echo MR image than in the first single-echo MR image can be attributed to flow-related intra-voxel dephasing and can be compensated by considering the signal amplitude in the second single-echo MR image only.

A cancellation of FID artifacts can be achieved according to the invention for the bipolar dual-echo readout (second imaging sequence) by averaging of two acquisitions with opposite phases of the refocusing RF pulses without increasing the scan time. For this purpose, a phase-encoding magnetic field gradient ('blip gradient') is switched between the two echo signals of each pair of echo signals generated by the second imaging sequence. Each pair of echo signals is acquired twice, each time using the same phase encoding but opposed phases of the RF refocusing pulses. In this way, two different k-space lines are acquired in each time interval between two refocusing RF pulses. These two k-space lines are measured twice in two acquisitions with opposite phase of the refocusing pulses and then separately averaged for a cancellation of FID artifacts.

The method of the invention described thus far can be carried out by means of a MR device including at least one main magnet coil for generating an essentially uniform, static magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
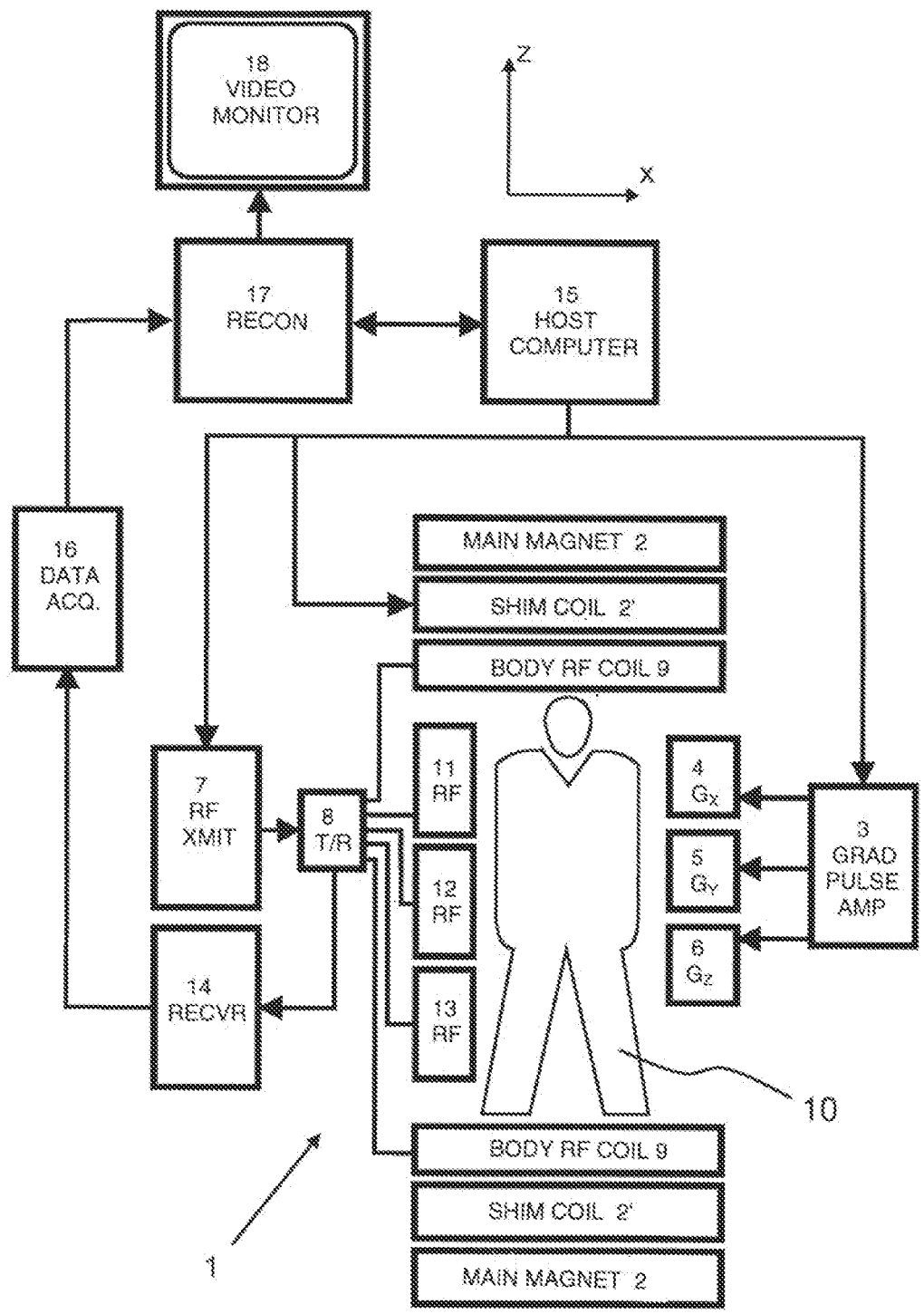
FIG. 1 shows a MR device for carrying out the method of the invention.
Figure 2:
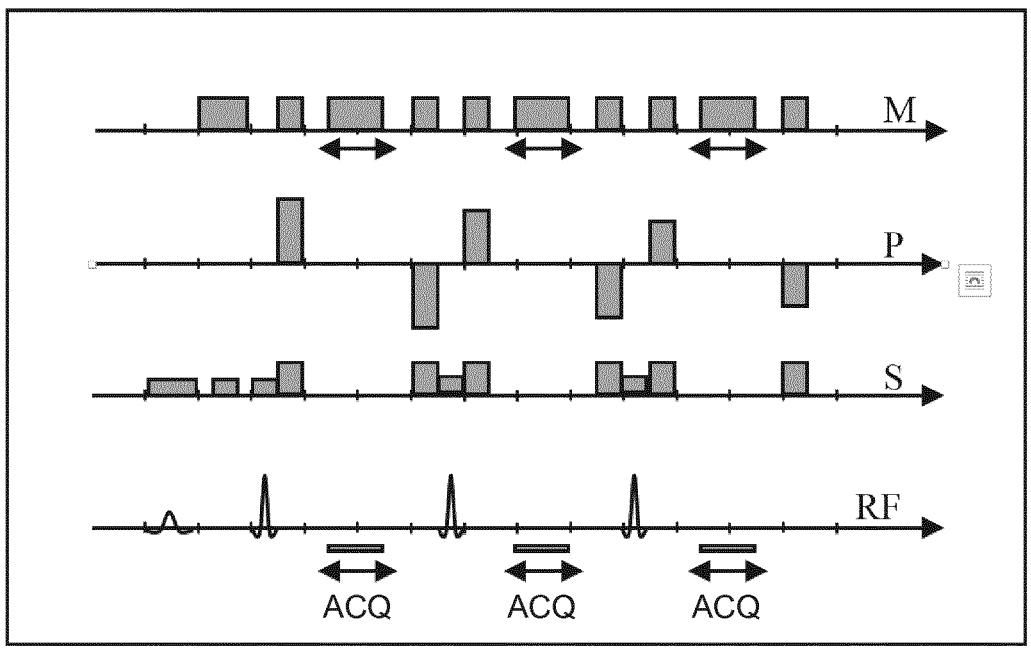
FIG. 2 shows a schematic (simplified) pulse sequence diagram of a conventional TSE Dixon imaging sequence.

With reference to FIG. 1, a MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to saturate resonance, excite resonance, invert magnetization, refocus resonance, or manipulate resonance and select a portion of a body 10 positioned in the examination volume. The MR signals are also picked up by the body RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions. The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via the send/receive switch 8.

A host computer 15 controls the shimming coils 2' as well as the gradient pulse amplifier 3 and the transmitter 7 to generate the imaging sequences of the invention. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

According to the invention, efficient TSE Dixon imaging is achieved by combining a unipolar single-echo readout at a low receive bandwidth with a bipolar dual-echo readout at a high bandwidth to maximize the SNR.

Figure 3:
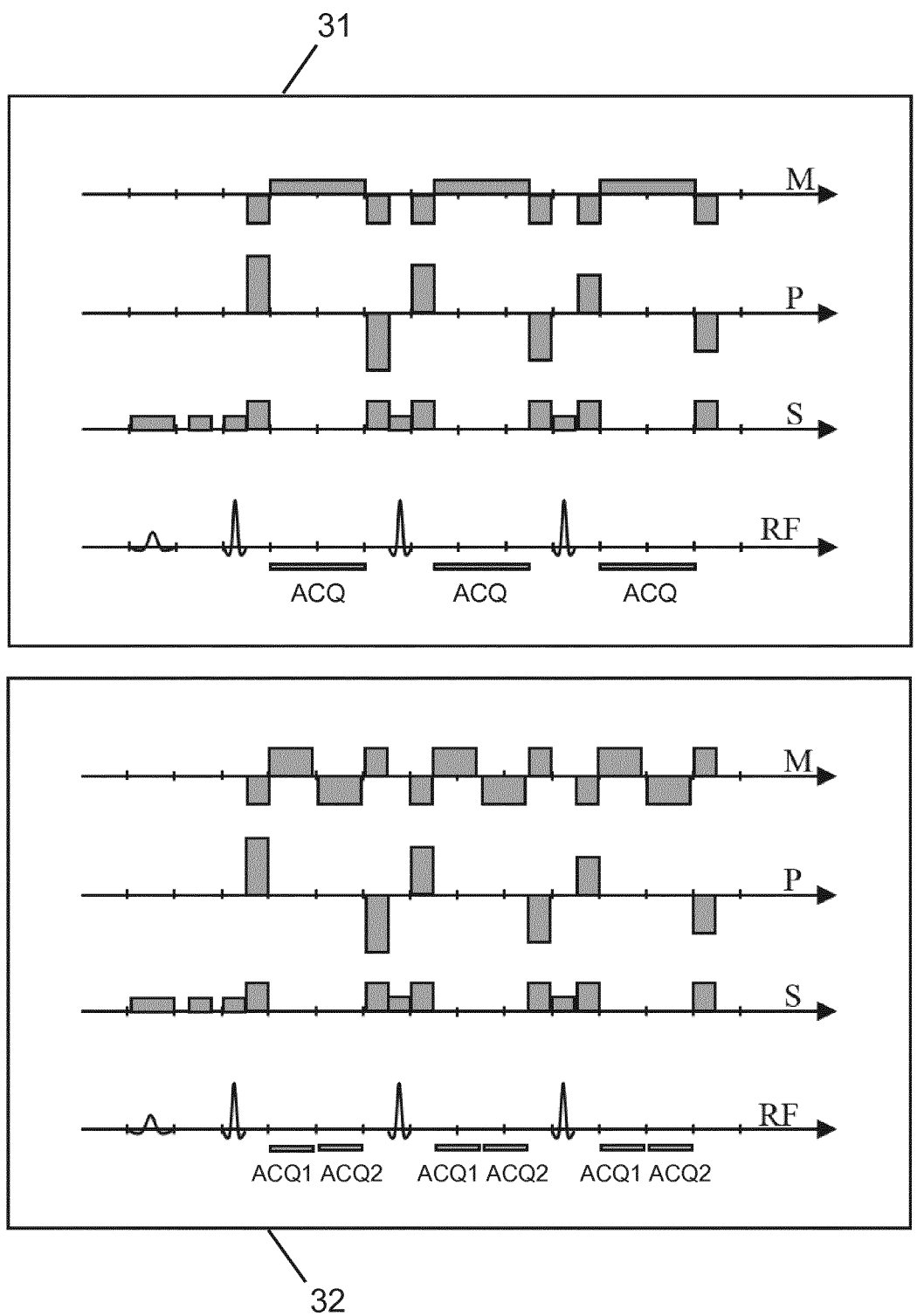
FIG. 3 shows schematic (simplified) pulse sequence diagrams of the first and second imaging sequences according to the invention.

This is illustrated in FIG. 3.

FIG. 3 shows a pulse sequence diagram 31 of a TSE sequence constituting a first imaging sequence according to the invention. The diagram 31 shows switched magnetic field gradients in the frequency-encoding direction (M), the phase-encoding direction (P) and the slice-selection direction (S). Moreover, the diagram shows the RF excitation and refocusing pulses as well as the time intervals during which echo signals are acquired, designated by ACQ. A single echo signal is acquired during each interval ACQ at a first (low) receive bandwidth to obtain a high SNR. To this end, comparatively weak unipolar readout magnetic field gradients (in the M-direction) are chosen. A high sampling efficiency is reached in the first imaging sequence by sampling the MR signals during most of the interspacing between the refocusing pulses.

FIG. 3 shows a further pulse sequence diagram 32 for the second imaging sequence according to the invention. The second imaging sequence is also a TSE sequence with echo shifting to obtain a pair of echo signals in each time interval between two consecutive refocusing RF pulses. The pairs of echo signals are acquired using bipolar readout magnetic field gradients. Each pair of echo signals is acquired using a corresponding pair of readout magnetic field gradients having opposed polarities. The corresponding signal acquisition periods are indicated by ACQ1 and ACQ2. The first echo signal of each pair of echo signals is acquired during interval ACQ1 while the second echo signal of each pair of echo signals is acquired during interval ACQ2. In the depicted example, the spacing between the refocusing RF pulses is essentially identical in the first and second imaging sequences, while the readout magnetic field gradient strength as well as the receiving signal bandwidth are doubled in the second imaging sequence with respect to the first imaging sequence to enable echo shifting.

The two separate TSE sequences according to diagrams 31 and 32 are applied in an interleaved fashion according to the invention. The first and second imaging sequences are used to acquire the single echo signals and the pairs of echo signals respectively. The timing of the bipolar readout gradients in the second imaging sequence (diagram 32) is chosen to shift the acquisition windows ACQ1, ACQ2 of the echo signals such that different phase offsets of the signal contributions from water protons and fat protons are provided on which the Dixon-type separation of these signal contributions is based in the final step of MR image reconstruction.

For example, three single-echo MR images can be reconstructed from the echo signals generated by the first and second imaging sequences according to the invention. A three-point Dixon method can then directly be applied to the three single-echo MR images for separating the contributions from fat and water protons. The water/fat separation can be modeled by $$\begin{bmatrix} S_1' \\ S_2' \\ S_3' \end{bmatrix} = \begin{bmatrix} 1 & c^* \\ 1 & 1 \\ 1 & c \end{bmatrix} \begin{bmatrix} W \\ F \end{bmatrix},$$

with $S_1'$-$S_3'$ being the voxel values in the three single-echo MR images (after correction of the effects of macroscopic magnetic field inhomogeneities), W and F being the complex water and fat contributions, and c being the complex phase offset $e^{i\alpha}$ of F with respect to W at the (positive) echo shift (assuming, for the sake of simplicity, a single-peak spectral model of fat protons). On this basis, the water and fat signal contributions can be estimated for each voxel by a least squares fitting approach (see Reeder et al., Magnetic Resonance in Medicine, 51, 35-45, 2004). However, in a preferred embodiment, the difference in SNR in the single-echo images is taken into account by using a correspondingly weighted linear least squares estimation instead, which provides a better SNR.

Figure 4:
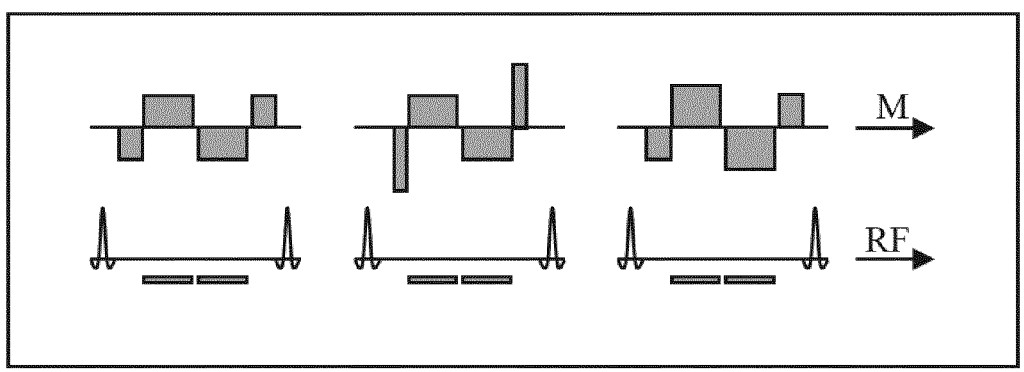
FIG. 4 schematically shows details of the bipolar readout magnetic field gradient applied in the second imaging sequence shown in FIG. 3.

Regarding flow compensation, if the first moment of the readout magnetic field gradient at the respective subsequent refocusing pulse is considered as more critical than the first moment of the readout magnetic field gradient at the time of one of the echo signals, the former can be reduced by shortening and strengthening the initial dephasing and the final rephasing lobes of the readout magnetic field gradients (while preserving their area). This is illustrated in the middle diagram of FIG. 4. The left diagram shows the readout magnetic field gradient lobes from diagram 32 of FIG. 3. The first moment can even be set to zero by strengthening the two middle lobes of the readout magnetic field gradient (possibly entailing the acquisition of partial echoes), as illustrated in the right diagram of FIG. 4. However, the first moment of the readout magnetic field gradient is then no longer zero at the time of the second echo signal.

Concerning the cancellation of FID artifacts in the bipolar dual-echo readout, a phase encoding magnetic field gradient ('blip') can be introduced between the two acquisition intervals ACQ1, ACQ2, such that two different k-space lines are acquired in each interval between two consecutive refocusing RF pulses. In other words, the application of the blip magnetic field gradient leads to one half of the k-space lines being acquired with a negative shift of the echo signals and the other half of the k-space lines being acquired with a positive shift of the echo signals. These two subsets of k-space lines can simply be matched by exploiting their conjugate complex symmetry. A possible phase in the MR image is known from the echo signals generated with the first imaging sequence and can be considered appropriately in this process.

Moreover, the information gained on the FID artifacts by the bipolar dual-echo readout can be used to also suppress FID artifacts in the unipolar single-echo readout, without increasing scan time. For example, a first water/fat separation can be performed without such a suppression. If it indicates that a certain voxel essentially contains either water or fat, the FID contribution in this voxel known from the bipolar dual-echo readout can be modulated to reflect the phase evolution from the respective shift of the echo signals to the spin echo, using the information on the main magnetic field inhomogeneity provided by the first water/fat separation, and then subtracted from the corresponding signal in this voxel obtained from the unipolar single-echo readout. This can be limited to those voxels for which the FID contribution exceeds a certain threshold to limit potential loss of SNR. Subsequently, a second water/fat separation can be performed. It is also conceivable to perform a water/fat separation on the FID contribution only, in order to accurately predict the FID contribution to the signal obtained from the unipolar single-echo readout even for voxels containing a mixture of water and fat.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method of magnetic resonance (MR) imaging of an object placed in an examination volume of a MR device, the method comprising the steps of:
    subjecting the object to an imaging sequence including a series of refocusing RF pulses which generate a single spin echo between consecutive refocusing RF pulses,
    applying a single bipolar readout magnetic field gradient during the single spin-echo to provide a first portion of the single spin echo with a first polarity and a second portion of the single spin echo with a second polarity,
    reading out a pair of echo signals during each bipolar readout magnetic field gradient and a first of the readout pair of echo signals being encoded with the first polarity and a second of the pair of readout echo signals being encoded with the second polarity,
    combining each pair of echo signals to form a virtual echo signal,
    separating signal contributions of water protons and fat protons from the pair of readout echo signals and the virtual echo signal corresponding to each single spin echo such that separated water and fat proton contributions are determined from each single spin echo,
    reconstructing a MR image from the acquired echo signals using the separated signal contributions from water protons and fat protons.

2. The method of claim 1, wherein each virtual echo signal is computed by phase correcting and averaging the echo signals of each pair of readout echo signals.

3. The method of claim 1, wherein a phase-encoding magnetic field gradient is switched between the echo signals of each pair of echo signals generated by the imaging sequence.

4. The method of claim 3, wherein each pair of echo signals is acquired twice, each time using opposite polarity phase encoding.

5. A method of magnetic resonance (MR) imaging of an object placed in an examination volume of a MR device, the method comprising the steps of:
    subjecting the object to a first imaging sequence including a first series of refocusing RF pulses and generating a single echo is in each time interval between two consecutive refocusing RF pulses of the first series,
    applying a single unipolar readout magnetic field gradient during each single echo,
    reading out a single echo signal with a first receive bandwidth during each unipolar readout magnetic field gradient,
    subjecting the object to a second imaging sequence including a second series of the refocusing RF pulses and applying a single bipolar readout gradient in each time interval between two consecutive refocusing RF pulses,
    reading out a pair of echo signals from the object at a second receive bandwidth during each bipolar readout magnetic field gradient, wherein the second receive bandwidth is higher than the first receive bandwidth,
    separating signal contributions from water protons and fat protons from the pairs of echo signals from the second echo sequence and the single echo signals from the first echo sequence, and
    reconstructing an MR image from the echo signals of the first and second sequences.

6. The method of claim 5, wherein the bipolar readout magnetic field gradients are stronger than the unipolar readout magnetic field gradients.

7. The method of claim 5, wherein each pair of echo signals is combined into a virtual echo signal, wherein signal contributions from water protons and fat protons are separated by a two-point Dixon technique using the echo signals generated by the first imaging sequence and the virtual echo signals.

8. The method of claim 7, wherein each virtual echo signal is computed by phase correcting and averaging the echo signals of each pair of echo signals.

9. The method of claim 5, wherein signal contributions from water protons and fat protons are separated by a three-point Dixon technique using the echo signals generated by the first and second imaging sequences.

10. The method of claim 5, wherein a phase-encoding magnetic field gradient is switched between the two echo signals of each pair of echo signals generated by the second imaging sequence.

11. The method of claim 10, wherein each pair of echo signals is acquired twice with opposite phase encoding.

12. The method of claim 11, wherein free induction decay (FID) artifact information is derived by comparing the pairs of echo signals acquired using the opposite polarity phase encoding and correcting FID artifacts in the acquired echo signals generated by the first imaging sequence using the FID artifact information.

13. A magnetic resonance (MR) device comprising:
    at least one main magnet coil for generating a uniform, static magnetic field B0 within an examination volume,
    a plurality of gradient coils for generating switched magnetic field gradients in different spatial directions within the examination volume,
    at least one RF coil configured to perform at least one of generating RF pulses within the examination volume and receiving MR signals from an object positioned in the examination volume,
    at least one computer configured to:
        control the at least one RF coil to subject the object to a first imaging sequence including a series of refocusing RF pulses to generate a single spin echo between consecutive pairs of refocusing RF pulses,
        control the gradient coils to apply a single bipolar readout magnetic field gradient during each spin echo,
        control the at least one RF coil to readout a pair of echo signals during each bipolar readout magnetic field gradient,
        separate signal contributions of water protons and fat protons from the pair of echo signals, and
        reconstruct an MR image from the readout echo signals.

14. A computer program to be run on a magnetic resonance (MR) device, which computer program comprises non-transitory computer readable instructions for executing the method of claim 1.

15. The method of claim 1 wherein reconstructing the MR image includes one of reconstructing a water MR image and a fat MR image.

16. The method of claim 3 further including subjecting the object to an additional series of RF refocusing pulses with a unipolar polar readout magnetic field gradient of a common duration to the bipolar magnetic field gradient and reading out a single echo signal between each pair of refocusing pulses.

17. The magnetic resonance device of claim 13, wherein the at least one computer is further configured to combine each pair of echo signals to form a single virtual echo signal, and wherein separating the signal contributions of the water protons and the fat protons includes using the pairs of echo signals and the virtual echo signals of the first imaging sequence, such that water and fat proton contributions are separated from a single spin echo.

18. The magnetic resonance device of claim 13, wherein the at least one computer is further configured to control the at least one RF coil to subject the object to a second imaging sequence including a second series of refocusing pulses which generate a single echo in the time interval between consecutive pairs of refocusing pulses of the second series, applying a single unipolar readout gradient coil during each single echo of the second imaging sequence, controlling the at least one RF coil to read out a single echo with a first receive bandwidth during each unipolar readout magnetic field gradient of the second imaging sequence with a second receive bandwidth, the second receive bandwidth being lower than the first receive bandwidth, and wherein separating the signal contributions from the water protons and the fat protons includes using the pair of readout echo signals from the first echo sequence and the single echo signals from the second echo sequence.

19. A non-transitory computer-readable medium carrying software configured to be run on one or more computers of a magnetic resonance device to execute the method of claim 5.

* * * * *